US012666578B2

(12) United States Patent
Wei Hong et al.

(10) Patent No.: US 12,666,578 B2
(45) Date of Patent: Jun. 23, 2026

(54) SERVER THERMAL MANAGEMENT

(71) Applicant: Sandisk Technologies, Inc., Milpitas, CA (US)

(72) Inventors: Tew Wei Hong, Simpang Ampat (MY); Chan Tze Ping, Jawi (MY); Lau Chun Sean, Bayan Lepas (MY)

(73) Assignee: Sandisk Technologies, Inc., Milpitas, CA (US)

( * ) Notice: Subject to any disclaimer, the term of this patent is extended or adjusted under 35 U.S.C. 154(b) by 446 days.

(21) Appl. No.: 18/448,633

(22) Filed: Aug. 11, 2023

(65) Prior Publication Data

US 2024/0324147 A1 Sep. 26, 2024

Related U.S. Application Data

(60) Provisional application No. 63/491,772, filed on Mar. 23, 2023.

(51) Int. Cl.
G06F 1/20 (2006.01)
G06F 11/30 (2006.01)
(Continued)

(52) U.S. Cl.
CPC ......... H05K 7/20836 (2013.01); G06F 1/206 (2013.01); G06F 11/3058 (2013.01);
(Continued)

(58) Field of Classification Search
CPC .. G06F 1/206; G06F 11/3034; G06F 11/3058; G06F 11/34; G06F 3/0604; G06F 3/0644; G08B 21/182; G11B 33/0461; H05K 7/20836; H05K 7/20718; G06N 3/08
(Continued)

(56) References Cited

U.S. PATENT DOCUMENTS

| | | | |
|---|---|---|---|
| 2014/0101371 A1* | 4/2014 | Nguyen | G06F 1/206 |
| | | | 711/103 |
| 2016/0162219 A1 | 6/2016 | Erez | |

(Continued)

FOREIGN PATENT DOCUMENTS

| | | | |
|---|---|---|---|
| JP | 2009027073 A | 2/2009 | |
| JP | 2012185764 A | 9/2012 | |

(Continued)

*Primary Examiner* — Chun Cao
(74) *Attorney, Agent, or Firm* — Michael Best & Friedrich LLP

(57) ABSTRACT

Servers, methods, and computer-readable media for performing thermal management of a server including a plurality of data storage devices. In one example, a server includes a controller configured to apply a machine learning model to identify a first portion of the plurality of data storage devices located in a hot zone relative to a second portion of the plurality of data storage devices located outside of the hot zone. The controller identifies the hot zone based on thermal data received from each of the plurality of data storage devices. Based on an identification of the first portion of the plurality of data storage devices located in the hot zone, the controller performs thermal management of the plurality of data storage devices by logically shuffling the plurality of data storage devices to create a distributed hot zone.

20 Claims, 21 Drawing Sheets

(51) Int. Cl.

| | |
|---|---|
| *G06F 11/34* | (2006.01) |
| *G08B 21/18* | (2006.01) |
| *G11B 33/04* | (2006.01) |
| *H05K 7/20* | (2006.01) |

(52) U.S. Cl.
CPC ............ *G06F 11/34* (2013.01); *G08B 21/182* (2013.01); *G11B 33/0461* (2013.01)

(58) Field of Classification Search
USPC ........................................................ 700/300
See application file for complete search history.

(56) References Cited

U.S. PATENT DOCUMENTS

| | | | |
|---|---|---|---|
| 2017/0046088 A1* | 2/2017 | Jayaraman | ............ G06F 3/0614 |
| 2019/0051576 A1 | 2/2019 | Roberts et al. | |
| 2019/0114107 A1 | 4/2019 | Gwin et al. | |
| 2019/0317672 A1* | 10/2019 | Linnen | ................. G06F 3/0659 |
| 2021/0318922 A1 | 10/2021 | Roberts | |
| 2022/0011967 A1 | 1/2022 | Mekhanik et al. | |

FOREIGN PATENT DOCUMENTS

| | | | |
|---|---|---|---|
| JP | 2014531698 A | 11/2014 | |
| WO | 2023029931 A1 | 3/2023 | |

* cited by examiner

| Working Hour | #1 | #2 | #3 | #4 | #5 | #6 | #7 | #8 | Amount Of Data Transmission (TB) In Drive | | | | | | | | | | | | |
| | | | | | | | | | #9 | #10 | #11 | #12 | #13 | #14 | #15 | #16 | #17 | #18 | #19 | #20 | #21 |
|---|---|---|---|---|---|---|---|---|---|---|---|---|---|---|---|---|---|---|---|---|---|
| 8am | 5 | 3 | 5 | 2 | 4 | 3 | 5 | 5 | 0 | 1 | 2 | 1 | 3 | 1 | 3 | 1 | 1 | 3 | 1 | 2 | 1 |
| 9am | 5 | 4 | 5 | 1 | 4 | 4 | 5 | 3 | 0 | 1 | 2 | 0 | 0 | 1 | 2 | 0 | 1 | 2 | 0 | 2 | 0 |
| 10am | 5 | 4 | 5 | 5 | 5 | 4 | 3 | 2 | 0 | 1 | 0 | 0 | 0 | 1 | 0 | 2 | 1 | 0 | 2 | 0 | 0 |
| 11am | 5 | 5 | 3 | 5 | 5 | 5 | 5 | 4 | 0 | 0 | 0 | 4 | 0 | 0 | 0 | 1 | 0 | 0 | 1 | 0 | 5 |
| 12pm | 5 | 5 | 3 | 5 | 5 | 4 | 3 | 5 | 0 | 0 | 0 | 0 | 1 | 2 | 0 | 1 | 2 | 0 | 1 | 0 | 0 |
| 1pm | 5 | 3 | 4 | 4 | 3 | 3 | 4 | 5 | 1 | 3 | 1 | 4 | 1 | 1 | 1 | 1 | 0 | 1 | 1 | 1 | 0 |
| 2pm | 5 | 4 | 4 | 4 | 4 | 5 | 5 | 5 | 2 | 2 | 2 | 3 | 1 | 0 | 2 | 2 | 5 | 1 | 2 | 2 | 3 |
| 3pm | 5 | 3 | 2 | 4 | 5 | 5 | 5 | 5 | 1 | 0 | 0 | 2 | 1 | 3 | 2 | 3 | 3 | 0 | 2 | 0 | 2 |
| 4pm | 5 | 4 | 3 | 3 | 5 | 5 | 1 | 4 | 1 | 1 | 1 | 1 | 3 | 1 | 0 | 2 | 1 | 0 | 2 | 1 | 1 |
| 5pm | 5 | 5 | 4 | 2 | 5 | 5 | 1 | 3 | 1 | 1 | 0 | 0 | 1 | 2 | 0 | 0 | 2 | 0 | 0 | 1 | 0 |

| #22 | #23 | #24 | #25 | #26 | #27 | #28 | #29 | #30 | #31 | #32 | #33 | #34 | #35 | #36 | #37 | #38 | #39 | #40 | #41 | #42 | #43 | #44 |
|---|---|---|---|---|---|---|---|---|---|---|---|---|---|---|---|---|---|---|---|---|---|---|
| 1 | 0 | 3 | 0 | 1 | 3 | 1 | 1 | 3 | 1 | 1 | 1 | 1 | 0 | 0 | 0 | 3 | 1 | 0 | 0 | 1 | 0 | 5 |
| 1 | 0 | 2 | 0 | 1 | 2 | 0 | 1 | 2 | 0 | 0 | 0 | 1 | 0 | 0 | 0 | 2 | 0 | 0 | 0 | 1 | 1 | 1 |
| 1 | 0 | 0 | 0 | 1 | 0 | 2 | 1 | 0 | 2 | 2 | 1 | 1 | 0 | 0 | 0 | 0 | 2 | 0 | 0 | 1 | 1 | 2 |
| 0 | 0 | 0 | 1 | 0 | 0 | 1 | 0 | 0 | 1 | 1 | 0 | 0 | 1 | 0 | 0 | 0 | 1 | 0 | 0 | 1 | 1 | 1 |
| 2 | 1 | 0 | 0 | 2 | 0 | 1 | 2 | 0 | 1 | 1 | 2 | 2 | 1 | 0 | 0 | 0 | 1 | 0 | 0 | 2 | 4 | 1 |
| 1 | 1 | 1 | 1 | 1 | 1 | 1 | 0 | 1 | 1 | 1 | 0 | 1 | 1 | 0 | 0 | 1 | 2 | 0 | 0 | 1 | 1 | 0 |
| 2 | 1 | 1 | 1 | 1 | 1 | 2 | 0 | 1 | 2 | 2 | 5 | 0 | 0 | 1 | 1 | 1 | 2 | 0 | 0 | 0 | 5 | 0 |
| 3 | 1 | 0 | 1 | 3 | 0 | 2 | 3 | 0 | 2 | 2 | 0 | 3 | 0 | 0 | 0 | 0 | 2 | 1 | 0 | 0 | 1 | 0 |
| 1 | 1 | 0 | 1 | 1 | 0 | 2 | 1 | 0 | 2 | 2 | 1 | 1 | 0 | 0 | 0 | 0 | 0 | 1 | 0 | 0 | 1 | 1 |
| 2 | 0 | 0 | 1 | 2 | 5 | 0 | 2 | 0 | 0 | 0 | 2 | 2 | 5 | 4 | 0 | 0 | 0 | 1 | 0 | 4 | 1 | 2 |

| Working Hour | #1 | #2 | #3 | #4 | #5 | #6 | #7 | #8 | #9 | #10 | #11 | #12 | #13 | #14 | #15 | #16 | #17 | #18 | #19 | #20 | #21 |
|---|---|---|---|---|---|---|---|---|---|---|---|---|---|---|---|---|---|---|---|---|---|
| 8am | 5 | 3 | 1 | 1 | 1 | 1 | 5 | 5 | 0 | 1 | 2 | 1 | 3 | 1 | 3 | 1 | 1 | 3 | 5 | 2 | 1 |
| 9am | 5 | 0 | 0 | 1 | 0 | 0 | 1 | 3 | 0 | 1 | 2 | 0 | 4 | 1 | 2 | 0 | 1 | 2 | 5 | 2 | 0 |
| 10am | 5 | 0 | 2 | 1 | 2 | 2 | 2 | 2 | 0 | 1 | 0 | 0 | 4 | 1 | 0 | 2 | 1 | 0 | 5 | 0 | 0 |
| 11am | 5 | 0 | 1 | 0 | 1 | 1 | 1 | 4 | 0 | 0 | 0 | 4 | 5 | 0 | 0 | 1 | 0 | 0 | 3 | 0 | 5 |
| 12pm | 5 | 1 | 1 | 1 | 1 | 1 | 1 | 5 | 0 | 0 | 0 | 0 | 5 | 2 | 0 | 1 | 2 | 0 | 3 | 0 | 0 |
| 1pm | 5 | 1 | 1 | 1 | 1 | 1 | 0 | 5 | 1 | 3 | 1 | 4 | 3 | 1 | 1 | 1 | 0 | 1 | 4 | 1 | 0 |
| 2pm | 5 | 1 | 2 | 1 | 2 | 2 | 0 | 5 | 2 | 2 | 2 | 3 | 4 | 0 | 0 | 2 | 5 | 1 | 4 | 2 | 3 |
| 3pm | 5 | 1 | 2 | 3 | 2 | 2 | 0 | 5 | 1 | 1 | 0 | 2 | 3 | 3 | 1 | 2 | 3 | 0 | 2 | 0 | 2 |
| 4pm | 5 | 3 | 2 | 1 | 2 | 2 | 1 | 4 | 1 | 2 | 1 | 1 | 4 | 1 | 0 | 0 | 1 | 3 | 3 | 1 | 1 |
| 5pm | 5 | 1 | 0 | 2 | 0 | 0 | 2 | 3 | 1 | 1 | 1 | 0 | 5 | 2 | 0 | 2 | 2 | 0 | 4 | 1 | 0 |

Amount Of Data Transmission (TB) In Drive

FIG. 5

| | #22 | #23 | #24 | #25 | #26 | #27 | #28 | #29 | #30 | #31 | #32 | #33 | #34 | #35 | #36 | #37 | #38 | #39 | #40 | #41 | #42 | #43 | #44 |
|---|---|---|---|---|---|---|---|---|---|---|---|---|---|---|---|---|---|---|---|---|---|---|---|
| | 0 | 1 | 3 | 0 | 2 | 3 | 1 | 1 | 3 | 1 | 4 | 1 | 1 | 0 | 0 | 0 | 3 | 3 | 0 | 0 | 1 | 0 | 5 |
| | 0 | 1 | 2 | 0 | 1 | 2 | 0 | 1 | 2 | 0 | 4 | 1 | 1 | 0 | 0 | 0 | 2 | 4 | 0 | 0 | 1 | 1 | 5 |
| | 0 | 1 | 0 | 0 | 5 | 0 | 2 | 1 | 0 | 2 | 5 | 1 | 1 | 0 | 0 | 0 | 0 | 4 | 0 | 0 | 1 | 1 | 3 |
| | 0 | 0 | 0 | 0 | 5 | 0 | 1 | 0 | 0 | 1 | 5 | 0 | 0 | 1 | 0 | 0 | 0 | 5 | 0 | 0 | 1 | 1 | 5 |
| | 1 | 2 | 0 | 1 | 5 | 0 | 1 | 2 | 0 | 1 | 3 | 2 | 2 | 1 | 0 | 0 | 0 | 4 | 0 | 0 | 2 | 4 | 3 |
| | 1 | 1 | 1 | 0 | 4 | 1 | 2 | 0 | 1 | 2 | 4 | 5 | 1 | 1 | 0 | 0 | 1 | 3 | 0 | 0 | 1 | 1 | 4 |
| | 1 | 2 | 1 | 0 | 4 | 0 | 2 | 0 | 0 | 2 | 5 | 0 | 0 | 0 | 1 | 1 | 0 | 5 | 0 | 0 | 0 | 5 | 5 |
| | 1 | 3 | 0 | 1 | 4 | 0 | 2 | 3 | 0 | 2 | 4 | 1 | 3 | 0 | 0 | 0 | 1 | 5 | 1 | 0 | 0 | 1 | 5 |
| | 1 | 1 | 0 | 1 | 3 | 0 | 2 | 1 | 0 | 2 | 5 | 1 | 1 | 0 | 0 | 0 | 0 | 5 | 1 | 0 | 0 | 1 | 5 |
| | 0 | 2 | 0 | 1 | 2 | 5 | 0 | 2 | 0 | 0 | 5 | 2 | 2 | 5 | 4 | 0 | 0 | 5 | 1 | 0 | 4 | 1 | 1 |

Receive SSD Thermal Data
604

Generate/Update Heat Map
606

Perform Thermal Analysis
610

Hot Zone Identified?
612

NO

YES

Logically Shuffle SSDs Based on Hot Zone
614

700a

Amount Of Data Transmission (TB) In Drive

| Working Hour (UTC -5) | #1 | #2 | #3 | #4 | #5 | #6 | #7 | #8 | #9 | #10 | #11 | #12 | #13 | #14 | #15 | #16 | #17 | #18 | #19 | #20 | #21 |
|---|---|---|---|---|---|---|---|---|---|---|---|---|---|---|---|---|---|---|---|---|---|
| 12am | 0 | 0 | 1 | 0 | 1 | 0 | 0 | 0 | 1 | 5 | 5 | 5 | 5 | 5 | 5 | 5 | 4 | 1 | 0 | 1 | 5 |
| 1am | 0 | 0 | 0 | 0 | 0 | 0 | 0 | 0 | 0 | 5 | 5 | 5 | 5 | 5 | 5 | 5 | 4 | 0 | 0 | 0 | 5 |
| 2am | 0 | 0 | 0 | 0 | 0 | 0 | 0 | 0 | 0 | 4 | 4 | 4 | 4 | 4 | 5 | 5 | 5 | 0 | 0 | 0 | 4 |
| 3am | 0 | 0 | 0 | 0 | 0 | 0 | 0 | 0 | 0 | 5 | 5 | 5 | 5 | 5 | 5 | 5 | 5 | 0 | 0 | 0 | 5 |
| 4am | 0 | 0 | 0 | 0 | 0 | 0 | 0 | 0 | 0 | 5 | 4 | 5 | 5 | 5 | 5 | 5 | 5 | 0 | 0 | 0 | 4 |
| 5am | 1 | 1 | 0 | 1 | 0 | 0 | 1 | 1 | 2 | 5 | 4 | 5 | 4 | 5 | 4 | 5 | 4 | 0 | 1 | 0 | 4 |
| 6am | 0 | 1 | 0 | 1 | 1 | 1 | 2 | 2 | 1 | 5 | 5 | 5 | 4 | 5 | 5 | 5 | 3 | 1 | 1 | 0 | 5 |
| 7am | 2 | 1 | 2 | 1 | 1 | 2 | 2 | 1 | 1 | 4 | 4 | 4 | 3 | 4 | 5 | 5 | 2 | 2 | 1 | 1 | 4 |
| 8am | 3 | 2 | 3 | 1 | 1 | 2 | 2 | 1 | 2 | 3 | 4 | 3 | 3 | 5 | 4 | 5 | 2 | 3 | 1 | 1 | 4 |
| 9am | 4 | 2 | 3 | 1 | 5 | 2 | 3 | 2 | 0 | 2 | 4 | 3 | 2 | 4 | 3 | 0 | 0 | 3 | 1 | 5 | 2 |
| 10am | 5 | 4 | 3 | 5 | 4 | 4 | 4 | 4 | 5 | 2 | 3 | 2 | 1 | 1 | 2 | 0 | 0 | 3 | 5 | 4 | 1 |
| 11am | 5 | 4 | 4 | 4 | 3 | 4 | 5 | 5 | 4 | 0 | 2 | 1 | 1 | 1 | 1 | 0 | 0 | 4 | 4 | 3 | 1 |
| 12pm | 5 | 5 | 5 | 4 | 5 | 5 | 4 | 5 | 5 | 0 | 1 | 1 | 0 | 0 | 0 | 0 | 0 | 5 | 4 | 5 | 1 |
| 1pm | 5 | 4 | 5 | 4 | 4 | 5 | 5 | 5 | 4 | 0 | 0 | 0 | 0 | 0 | 0 | 0 | 0 | 5 | 4 | 4 | 0 |
| 2pm | 5 | 5 | 5 | 3 | 4 | 5 | 5 | 5 | 5 | 0 | 0 | 0 | 0 | 0 | 0 | 0 | 0 | 5 | 3 | 4 | 0 |
| 3pm | 4 | 5 | 5 | 5 | 4 | 5 | 4 | 4 | 5 | 0 | 0 | 0 | 0 | 0 | 0 | 0 | 0 | 5 | 5 | 4 | 0 |
| 4pm | 4 | 4 | 4 | 5 | 4 | 4 | 4 | 4 | 5 | 0 | 0 | 0 | 0 | 0 | 0 | 0 | 0 | 4 | 5 | 4 | 0 |
| 5pm | 3 | 5 | 4 | 5 | 5 | 5 | 5 | 4 | 5 | 0 | 0 | 0 | 0 | 0 | 0 | 0 | 0 | 5 | 5 | 5 | 0 |
| 6pm | 2 | 5 | 4 | 5 | 4 | 4 | 4 | 4 | 5 | 0 | 0 | 0 | 0 | 0 | 0 | 1 | 0 | 4 | 4 | 4 | 0 |
| 7pm | 1 | 5 | 3 | 2 | 3 | 2 | 5 | 4 | 4 | 1 | 1 | 0 | 1 | 0 | 2 | 1 | 0 | 5 | 3 | 3 | 1 |
| 8pm | 1 | 2 | 2 | 2 | 2 | 0 | 4 | 3 | 3 | 2 | 1 | 1 | 1 | 1 | 2 | 1 | 3 | 2 | 2 | 2 | 1 |
| 9pm | 0 | 1 | 1 | 2 | 2 | 1 | 3 | 3 | 3 | 3 | 2 | 2 | 2 | 1 | 2 | 0 | 2 | 1 | 2 | 2 | 2 |
| 10pm | 0 | 0 | 1 | 2 | 1 | 1 | 0 | 2 | 0 | 4 | 5 | 4 | 4 | 2 | 3 | 5 | 1 | 1 | 2 | 1 | 5 |
| 11pm | 0 | 0 | 0 | 0 | 1 | 0 | 0 | 1 | 0 | 4 | 4 | 3 | 3 | 5 | 4 | 4 | 3 | 0 | 0 | 1 | 4 |

708    712    708

Before Reshuffle

FIG. 7

High Temperature

Low Temperature

110

708     712     708     712     708     712     708     712     708

1 2 3 4 5 6 7 8 9 10 11 12 13 14 15 16 17 18 19 20 21 22 23 24 25 26 27 28 29 30 31 32 33 34 35 36 37 38 39 40 41 42 43 44

Temperature Of Drives In
Server From 10am To 9pm

Temperature Of Drives In
Server From 9pm To 10am

High Temperature

Low Temperature

Temperature Of Drives In
Server From 10am To 9pm

Temperature Of Drives In
Server From 9pm To 10am

700b

| Working Hour (UTC -5) | Amount Of Data Transmission (TB) In Drive | | | | | | | | | | | | | | | | | | | | |
|---|---|---|---|---|---|---|---|---|---|---|---|---|---|---|---|---|---|---|---|---|---|
| | #1 | #2 | #3 | #4 | #5 | #6 | #7 | #8 | #9 | #10 | #11 | #12 | #13 | #14 | #15 | #16 | #17 | #18 | #19 | #20 | #21 |
| 12am | 0 | 5 | 0 | 5 | 1 | 5 | 0 | 5 | 1 | 5 | 0 | 5 | 0 | 5 | 0 | 4 | 1 | 5 | 1 | 5 | 0 |
| 1am | 0 | 5 | 0 | 5 | 0 | 5 | 0 | 5 | 0 | 4 | 0 | 5 | 0 | 5 | 0 | 4 | 0 | 5 | 0 | 5 | 0 |
| 2am | 0 | 5 | 0 | 4 | 0 | 5 | 0 | 4 | 0 | 5 | 0 | 4 | 0 | 5 | 0 | 5 | 0 | 4 | 0 | 5 | 0 |
| 3am | 0 | 5 | 0 | 5 | 0 | 5 | 0 | 5 | 0 | 5 | 0 | 5 | 0 | 5 | 0 | 5 | 0 | 5 | 0 | 5 | 0 |
| 4am | 0 | 5 | 1 | 4 | 0 | 5 | 1 | 4 | 0 | 5 | 0 | 5 | 1 | 5 | 1 | 5 | 2 | 4 | 0 | 5 | 0 |
| 5am | 1 | 5 | 1 | 4 | 0 | 5 | 1 | 4 | 0 | 5 | 1 | 4 | 1 | 5 | 2 | 4 | 1 | 4 | 0 | 5 | 1 |
| 6am | 0 | 5 | 1 | 5 | 2 | 4 | 1 | 4 | 1 | 4 | 2 | 5 | 2 | 5 | 1 | 3 | 1 | 5 | 0 | 4 | 1 |
| 7am | 2 | 4 | 2 | 4 | 3 | 4 | 1 | 3 | 1 | 5 | 2 | 5 | 1 | 5 | 1 | 2 | 2 | 4 | 2 | 4 | 1 |
| 8am | 3 | 3 | 2 | 4 | 3 | 4 | 1 | 3 | 1 | 4 | 2 | 4 | 2 | 5 | 2 | 2 | 0 | 2 | 3 | 4 | 1 |
| 9am | 4 | 2 | 2 | 2 | 3 | 3 | 1 | 2 | 5 | 1 | 2 | 3 | 3 | 0 | 4 | 0 | 0 | 1 | 3 | 3 | 5 |
| 10am | 5 | 2 | 4 | 1 | 3 | 3 | 5 | 1 | 4 | 1 | 4 | 2 | 4 | 0 | 5 | 5 | 5 | 1 | 3 | 3 | 4 |
| 11am | 5 | 0 | 4 | 1 | 4 | 2 | 4 | 1 | 3 | 1 | 4 | 1 | 5 | 0 | 5 | 4 | 4 | 1 | 4 | 2 | 4 |
| 12pm | 5 | 0 | 5 | 1 | 5 | 1 | 4 | 0 | 5 | 0 | 5 | 0 | 4 | 0 | 5 | 5 | 5 | 1 | 5 | 1 | 4 |
| 1pm | 5 | 0 | 4 | 0 | 5 | 0 | 4 | 0 | 4 | 0 | 5 | 0 | 5 | 0 | 5 | 4 | 4 | 0 | 5 | 0 | 4 |
| 2pm | 5 | 0 | 4 | 0 | 5 | 0 | 3 | 0 | 4 | 0 | 5 | 0 | 5 | 0 | 4 | 0 | 5 | 0 | 5 | 0 | 3 |
| 3pm | 4 | 0 | 5 | 0 | 5 | 0 | 5 | 0 | 4 | 0 | 4 | 0 | 4 | 0 | 4 | 0 | 5 | 0 | 5 | 0 | 5 |
| 4pm | 4 | 0 | 5 | 1 | 4 | 1 | 5 | 1 | 4 | 0 | 2 | 2 | 5 | 1 | 4 | 0 | 0 | 0 | 5 | 0 | 5 |
| 5pm | 3 | 0 | 5 | 1 | 3 | 3 | 2 | 2 | 1 | 1 | 0 | 2 | 4 | 1 | 3 | 2 | 3 | 1 | 0 | 0 | 4 |
| 6pm | 2 | 0 | 5 | 2 | 2 | 4 | 2 | 2 | 2 | 2 | 1 | 2 | 5 | 0 | 2 | 1 | 3 | 2 | 0 | 1 | 5 |
| 7pm | 1 | 1 | 5 | 1 | 1 | 4 | 2 | 4 | 1 | 1 | 0 | 3 | 4 | 5 | 1 | 3 | 0 | 1 | 1 | 3 | 2 |
| 8pm | 1 | 2 | 2 | 2 | 0 | 3 | 2 | 2 | 2 | 5 | 1 | 4 | 3 | 4 | 0 | 0 | 0 | 2 | 5 | 4 | 2 |
| 9pm | 0 | 3 | 1 | 5 | 0 | 4 | 2 | 2 | 1 | 0 | 0 | 4 | 0 | 5 | 2 | 2 | 5 | 5 | 0 | 2 | 3 |
| 10pm | 0 | 4 | 1 | 5 | 0 | 4 | 0 | 4 | 5 | 0 | 1 | 4 | 5 | 4 | 1 | 3 | 4 | 0 | 4 | 2 | 2 |
| 11pm | 0 | 4 | 0 | 4 | 0 | 4 | 0 | 3 | 1 | 5 | 0 | 4 | 4 | 4 | 1 | 3 | 4 | 0 | 4 | 4 | 0 |

After Reshuffle

FIG. 12

| | #22 | #23 | #24 | #25 | #26 | #27 | #28 | #29 | #30 | #31 | #32 | #33 | #34 | #35 | #36 | #37 | #38 | #39 | #40 | #41 | #42 | #43 | #44 |
|---|---|---|---|---|---|---|---|---|---|---|---|---|---|---|---|---|---|---|---|---|---|---|---|
| | 5 | 1 | 5 | 0 | 5 | 1 | 5 | 0 | 5 | 0 | 4 | 0 | 5 | 1 | 5 | 1 | 5 | 0 | 5 | 0 | 5 | 0 | 5 |
| | 5 | 0 | 5 | 0 | 4 | 0 | 5 | 0 | 5 | 0 | 4 | 0 | 5 | 0 | 5 | 0 | 5 | 0 | 5 | 0 | 5 | 0 | 5 |
| | 4 | 0 | 5 | 0 | 5 | 0 | 4 | 0 | 5 | 0 | 5 | 0 | 5 | 0 | 5 | 0 | 5 | 0 | 5 | 0 | 5 | 0 | 4 |
| | 5 | 0 | 5 | 0 | 5 | 0 | 5 | 0 | 5 | 0 | 5 | 0 | 5 | 0 | 5 | 0 | 5 | 0 | 5 | 0 | 5 | 0 | 5 |
| | 5 | 0 | 5 | 0 | 5 | 0 | 5 | 0 | 5 | 0 | 5 | 0 | 5 | 0 | 5 | 0 | 5 | 0 | 5 | 0 | 5 | 0 | 5 |
| | 4 | 0 | 5 | 1 | 5 | 0 | 4 | 0 | 5 | 1 | 4 | 1 | 5 | 2 | 5 | 0 | 5 | 0 | 5 | 1 | 5 | 1 | 4 |
| | 4 | 0 | 5 | 1 | 4 | 0 | 5 | 1 | 5 | 2 | 3 | 2 | 5 | 1 | 5 | 0 | 5 | 1 | 5 | 2 | 5 | 1 | 5 |
| | 3 | 1 | 5 | 1 | 4 | 1 | 5 | 2 | 5 | 1 | 2 | 1 | 5 | 1 | 5 | 1 | 5 | 2 | 5 | 1 | 5 | 2 | 5 |
| | 3 | 1 | 5 | 1 | 5 | 1 | 4 | 2 | 0 | 2 | 2 | 1 | 5 | 2 | 5 | 1 | 5 | 2 | 5 | 2 | 5 | 1 | 4 |
| | 2 | 5 | 0 | 1 | 4 | 5 | 3 | 2 | 0 | 3 | 0 | 2 | 0 | 0 | 0 | 5 | 0 | 2 | 0 | 3 | 0 | 1 | 3 |
| | 1 | 4 | 0 | 5 | 1 | 4 | 2 | 4 | 0 | 4 | 0 | 4 | 0 | 5 | 0 | 4 | 0 | 4 | 0 | 4 | 0 | 2 | 2 |
| | 1 | 3 | 0 | 4 | 1 | 3 | 1 | 4 | 0 | 5 | 0 | 5 | 0 | 4 | 0 | 3 | 0 | 4 | 0 | 5 | 0 | 4 | 1 |
| | 0 | 5 | 0 | 4 | 0 | 5 | 0 | 4 | 0 | 4 | 0 | 5 | 0 | 5 | 0 | 5 | 0 | 4 | 0 | 4 | 0 | 5 | 0 |
| | 0 | 4 | 0 | 4 | 0 | 4 | 0 | 5 | 0 | 5 | 0 | 5 | 0 | 4 | 0 | 4 | 0 | 5 | 0 | 5 | 0 | 5 | 0 |
| | 0 | 4 | 0 | 3 | 0 | 4 | 0 | 5 | 0 | 5 | 0 | 5 | 0 | 4 | 0 | 4 | 0 | 5 | 0 | 5 | 0 | 5 | 0 |
| | 0 | 4 | 0 | 5 | 0 | 4 | 0 | 5 | 0 | 4 | 0 | 5 | 0 | 5 | 0 | 4 | 0 | 5 | 0 | 4 | 0 | 5 | 0 |
| | 0 | 4 | 0 | 5 | 0 | 4 | 0 | 5 | 0 | 5 | 0 | 4 | 0 | 5 | 0 | 4 | 0 | 5 | 0 | 4 | 0 | 5 | 0 |
| | 0 | 5 | 0 | 4 | 0 | 5 | 0 | 4 | 0 | 4 | 0 | 4 | 0 | 5 | 0 | 5 | 0 | 4 | 0 | 5 | 0 | 4 | 0 |
| | 0 | 4 | 0 | 5 | 0 | 4 | 2 | 4 | 1 | 5 | 2 | 4 | 1 | 5 | 1 | 4 | 1 | 4 | 1 | 4 | 1 | 4 | 2 |
| | 1 | 3 | 1 | 2 | 1 | 3 | 2 | 2 | 1 | 4 | 1 | 3 | 1 | 4 | 1 | 3 | 1 | 2 | 1 | 5 | 1 | 4 | 2 |
| | 2 | 2 | 1 | 2 | 1 | 2 | 3 | 0 | 1 | 4 | 3 | 3 | 0 | 3 | 0 | 2 | 0 | 0 | 0 | 4 | 0 | 4 | 3 |
| | 2 | 2 | 0 | 2 | 2 | 2 | 4 | 1 | 5 | 3 | 3 | 2 | 5 | 3 | 5 | 2 | 5 | 1 | 5 | 4 | 5 | 3 | 4 |
| | 4 | 1 | 5 | 2 | 5 | 1 | 4 | 0 | 4 | 0 | | 1 | 4 | 0 | 4 | 1 | 4 | 0 | 4 | 3 | 4 | 2 | |
| | 3 | 1 | 4 | 0 | | 1 | 4 | 0 | | 0 | | 0 | 0 | 0 | 0 | 1 | 0 | 0 | 0 | 0 | 0 | 1 | |

Receive SSD Temperature Data
1304

Update Heat Map
1306

Perform Thermal Analysis
1310

Identify User Pattern
1312

Logically Shuffle SSDs Based on User Pattern
1314

SERVER THERMAL MANAGEMENT

CROSS-REFERENCE TO RELATED APPLICATION

This application claims priority to and the benefit of U.S. Provisional Patent Application No. 63/491,772, filed on Mar. 23, 2023, the entire contents of which is incorporated herein by reference.

FIELD

This application relates generally to server thermal management, and more specifically, the application relates to server thermal management using machine learning.

SUMMARY

Information management systems ("IMS") or servers for an enterprise may include a chassis system with multiple slots to accept data storage devices, such as solid-state drives ("SSDs"). Increases in the density of data storage devices within an IMS and/or server result in decreased size of air channels used for regulating the temperature within a chassis. When multiple data storage devices concentrated in a certain region of a server are operating at the same time, the data storage devices will generate heat energy, which may form hot zones in the server. A hot zone in the server reduces efficiency of heat transfer from the data storage devices to the outer environment, and can cause thermal throttling of one or more of the storage devices.

Thus, the disclosure provides a server, in one embodiment, including a memory configured to store a machine learning model, a plurality of data storage devices disposed in a chassis, and a controller coupled to the memory. The controller is configured to receive thermal data associated with the plurality of data storage devices, apply a machine learning model to identify, based on the thermal data, a first portion of the plurality of data storage devices located in a hot zone relative to a second portion of the plurality of data storage devices located outside of the hot zone, and, based on an identification of the first portion of the plurality of data storage devices located in the hot zone, perform thermal management of the plurality of data storage devices. To perform the thermal management, the controller is further configured to logically shuffle the plurality of data storage devices to create a distributed hot zone.

The disclosure also provides a method for performing thermal management in a server. The method includes receiving thermal data associated with a plurality of data storage devices, identifying, based on thermal data, a first portion of the plurality of data storage devices located in a hot zone relative to a second portion of the plurality of data storage devices located outside of the hot zone, and, based on an identification of the first portion of the plurality of data storage devices located in the hot zone, performing thermal management of the plurality of data storage devices. Performing thermal management includes logically shuffling the plurality of data storage devices to create a distributed hot zone.

The disclosure also provides a non-transitory computer readable medium storing instructions that, when executed by a controller, causes the controller to perform a set of operations including identifying, based on thermal data, a first portion of a plurality of data storage devices located in a hot zone relative to a second portion of the plurality of data storage devices located outside of the hot zone, and, based on an identification of the first portion of the plurality of data storage devices located in the hot zone, performing thermal management of the plurality of data storage devices. The thermal management includes logically shuffling the plurality of data storage devices to create a distributed hot zone.

Various aspects of the present disclosure provide for improvements in server thermal management. The present disclosure can be embodied in various forms, including hardware or circuits controlled by software, firmware, or a combination thereof. The foregoing summary is intended solely to give a general idea of various aspects of the present disclosure and does not limit the scope of the present disclosure in any way.

BRIEF DESCRIPTION OF THE DRAWINGS

FIG. 5 illustrates a heat map associated with the distributed hot zone and distributed cold zone of FIG. 4, in accordance with various aspects of the present disclosure.

FIG. 12 illustrates a heat map associated with a plurality of data storage devices with distributed hot zones and distributed cold zones, in accordance with various aspects of the present disclosure.

DETAILED DESCRIPTION

In the following description, numerous details are set forth, such as data storage device configurations, and the like, in order to provide an understanding of one or more aspects of the present disclosure. It will be readily apparent to one skilled in the art that these specific details are merely exemplary and not intended to limit the scope of this application. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, etc.

Figure 1:
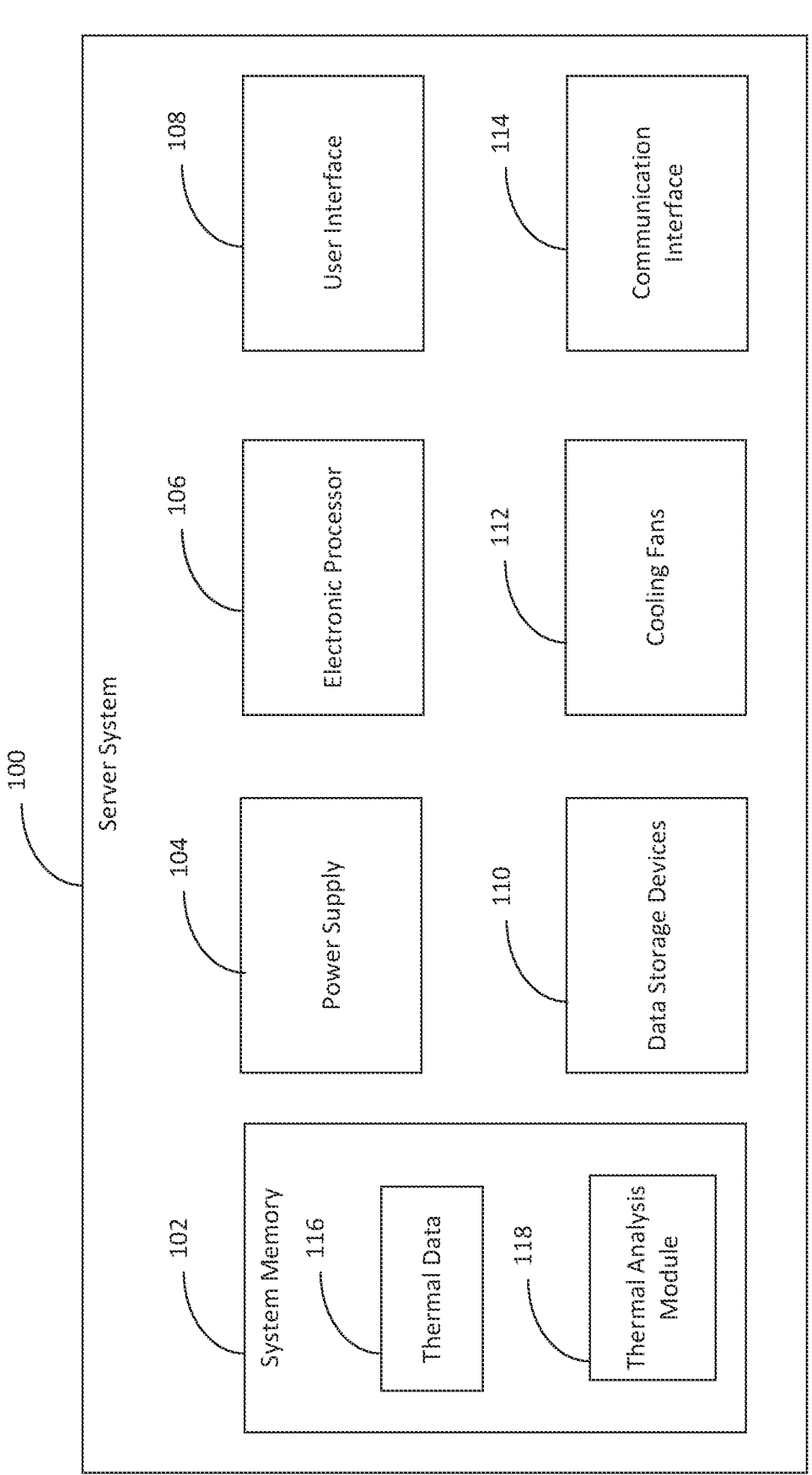
FIG. 1 illustrates a block diagram of a server, in accordance with various aspects of the present disclosure.

FIG. 1 is a block diagram of a server system 100, according to some embodiments. While the system 100 is described as a server system, it is understood that the system 100 may be an IMS system, or other system type which includes multiple data storage devices.

The server system 100 includes system memory 102, one or more power supplies 104, an electronic processor 106, a user interface 108, a plurality of data storage devices 110, one or more cooling fans 112 for facilitating air flow in the server system 100, and a communication interface 114. The communication interface 114 may include one or more communication devices, such as network interface devices. In one example, various information may be provided to, or requested from the one or more data storage devices 110 with the communication interface 114. The request for retrieval of data from the data storage devices 110 and/or the storage of data to the data storage devices 110 may be processed by the one or more processors 106. Generally, the server system 100 works as a general server system as required for a given application.

The plurality of data storage devices 110 are arranged in a chassis (e.g., chassis 200 illustrated in FIG. 2) of the server system 100. In one embodiment, the plurality of data storage devices 110 are solid-state drives ("SSD"), such as non-volatile NAND SSDs. However, other SSD types are also contemplated. Additionally, in other examples, the plurality of data storage devices 110 may be other data storage devices, such as hard-disk drives ("HDD"). The cooling fans 112 are configured to direct air towards (e.g., push) the one or more data storage devices 110. However, in other examples, the cooling fans 112 may be configured to direct air away (e.g., pull) from the data storage devices 110, resulting in air flow being pulled across the data storage devices 110 in a direction away from the data storage devices 110.

The memory 102 stores thermal data 116 associated with the data storage devices 110. For example, the memory 102 may periodically receive, from each of the plurality of data storage devices 110, temperature information related to an internal temperature of the data storage device.

The memory 102 further includes a thermal analysis module 118 for analyzing the thermal data 116, and determining a corrective action in the server system 100 based on the thermal analysis. In some instances, the thermal data 116 includes an amount of data operations performed by each of the plurality of data storage devices 110, and the electronic processor 106, in conjunction with the thermal analysis module 118, performs thermal analysis of the plurality of data storage devices 110 based on the data operations performed by each of the plurality of data storage devices 110. The electronic processor 106 may determine that a data storage device performing large amounts of data operations has a higher internal temperature than a data storage device performing low amounts of data operations.

The electronic processor 106 identifies end-user behavior based on data operations information. The electronic processor 106 then determines a control response based on the end-user behavior in order to maintain efficient heat dissipation in the server 100.

Figure 2:
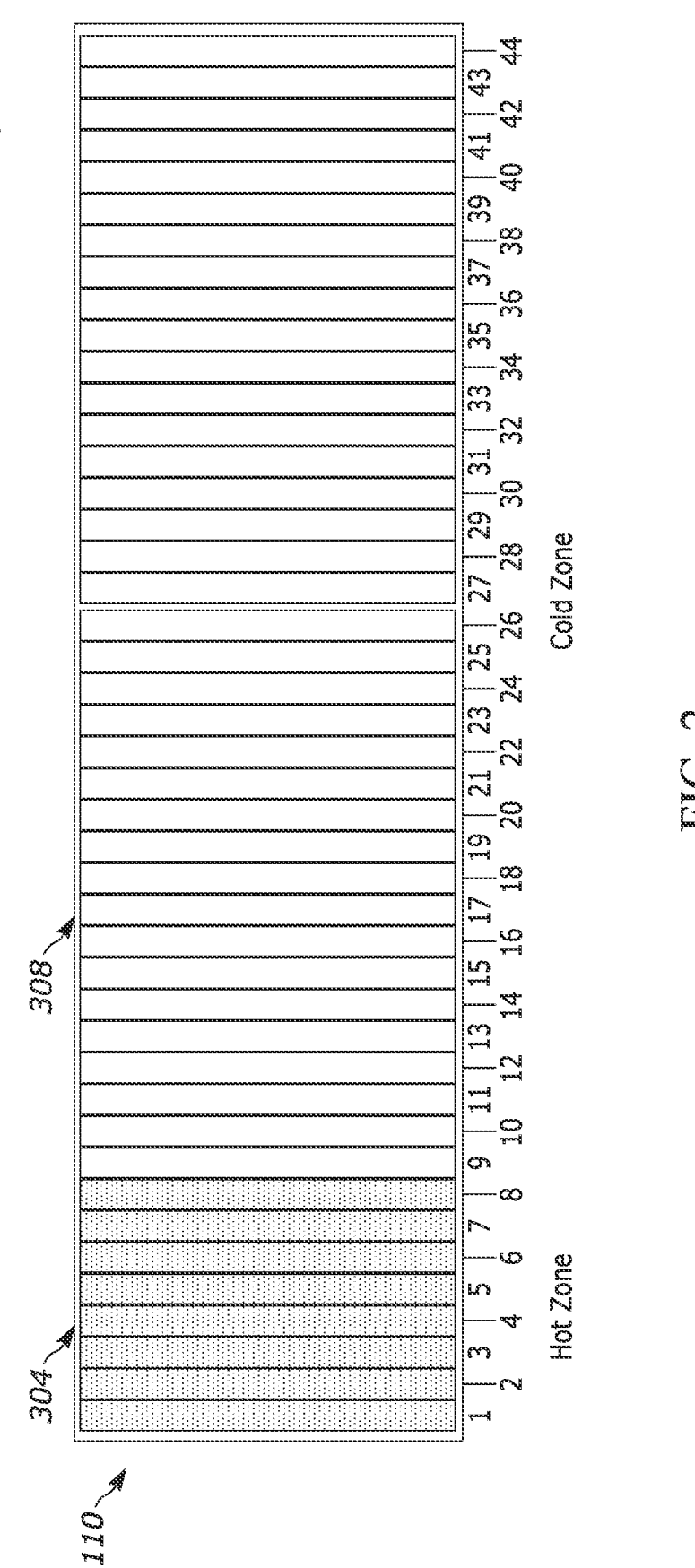
FIG. 2 illustrates a first portion of a plurality of data storage devices located in a hot zone relative to a second portion of the plurality of data storage devices located in a cold zone, in accordance with various aspects of the present disclosure.
Figure 3:
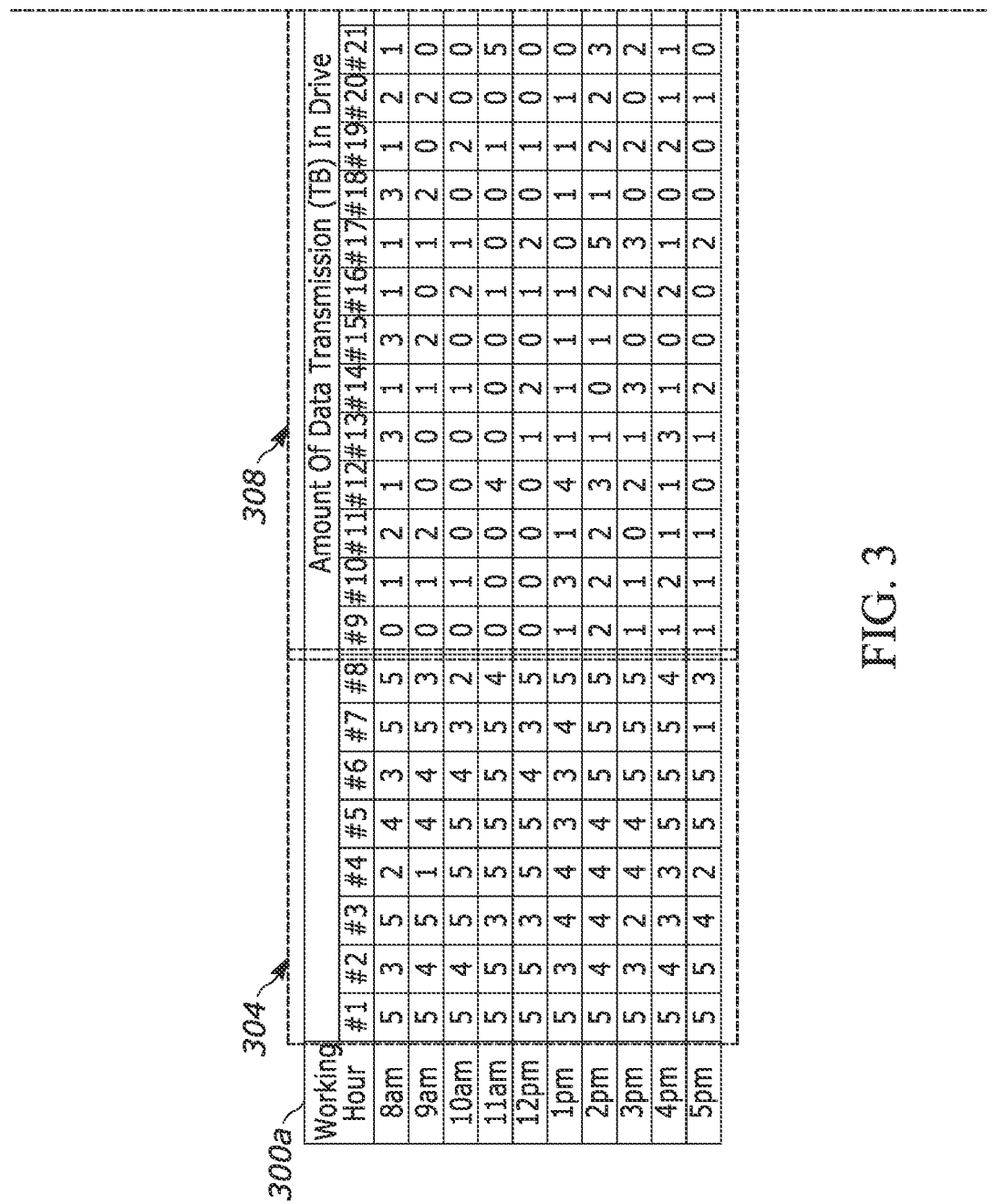
FIG. 3 illustrates a heat map associated with the hot zone and the cold zone of FIG. 2, in accordance with various aspects of the present disclosure.

The corrective action includes, for example, logically shuffling the plurality of data storage devices 110 according to end-user behavior. FIG. 2 illustrates a first portion of the plurality of data storage devices 110 located in a hot zone 304 relative to a second portion of the plurality of data storage devices located in a cold zone 308. FIG. 3 illustrates a heat map 300a associated with the hot zone 304 and the cold zone 308 of FIG. 2. The heat map 300a is generated by the electronic processor 106 in conjunction with the thermal analysis module 118, and includes a thermal plot of each of the plurality of data storage devices 110 according to the respective location of each data storage device within the server 100. For example, a data storage device labeled "#1" is adjacent to a data storage device labeled '#2.' Similarly, the data storage device labeled '#2' is also adjacent to a data storage device labeled '#3.'

While the example illustrated in FIGS. 2 and 3 includes forty-four data storage devices, the server 100 may include another suitable number of data storage devices. For example, the plurality of data storage devices 110 may include 10 data storage devices, data storage devices, 50 data storage devices, 110 data storage devices, or another suitable number of data storage devices.

An amount of data operations performed by each of the plurality of data storage devices 110 may vary based on end-user behavior of each data storage device. Therefore, the heat map 300a provides a comparison of thermal data over time for each of the plurality of data storage devices 110.

In the illustrated example, the heat map 300a includes data operations information from the hours of 8:00 AM to 5:00 PM, however, the heat map 300a may include thermal data for any suitable time period. For example, the heat map 300a may include thermal data collected over a 24 hour time period. The thermal data illustrated in FIG. 3 includes amounts of data transmission measured in terabytes (TB), however, the thermal data may, alternatively or in addition, include temperature measurement information from the plurality of data storage devices 110.

In the example illustrated in FIGS. 2 and 3, the electronic processor 106 may determine that data storage devices #1-#8 are generally more active than data storage devices #9-#44 over a first time period (e.g., from the hours of 8:00

AM to 5:00 PM). The electronic processor 106 may therefore determine that data storage devices #1-#8 define a hot zone 304, while data storage devices #9-#44 define a cold zone 308. In some instances, the electronic processor 106 may determine whether a data storage device is included in the hot zone 304 by determining whether a data storage device has performed, over the predetermined time period, an average amount of data operations that is greater than an average data operations threshold.

In some instances, the electronic processor 106 relies on a machine learning model included in the thermal analysis module to identify hot zones. The electronic processor 106 may identify a hot zone 304 by determining that at least two adjacent data storage devices exceed a thermal threshold (e.g., the average temperature threshold, the average data operations threshold, and the like). In some instances, the electronic processor 106 identifies a hot zone 304 by determining that another predetermined minimum number of adjacent data storage devices exceed the thermal threshold. In some instances, the electronic processor 106 identifies a hot zone 304 by determining that at least a minimum number of adjacent data storage devices relative to the total number of data storage devices included in the plurality of data storage devices 110 exceeds the thermal threshold.

The hot zone 304 may form as a result of a set of adjacent data storage devices performing heat-generating data operations (e.g., large amounts of data reads and data writes) for a period of time. Hot zones including many high temperature data storage devices cause inefficient heat dissipation in a server, which may reduce the performance of the server. Therefore, in response to identifying a hot zone 304 in the server 100, the electronic processor 106 performs a corrective action to create a more even heat distribution in the server 100. The corrective action includes, for example, logically shuffling the plurality of data storage devices 110 such that data storage devices performing heat-generating data operations are evenly distributed in the chassis of the server 100. The electronic processor 106 logically shuffles the plurality of data storage devices 110 by exchanging memory locations and data within the plurality of data storage devices 110.

Figure 4:
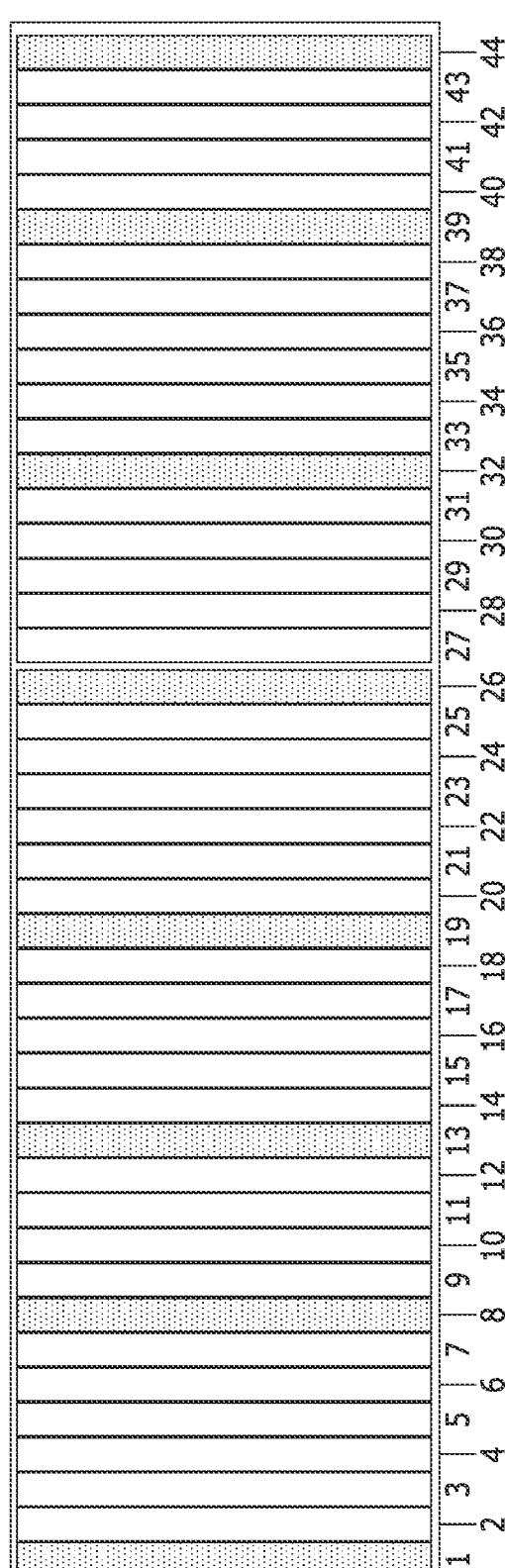
FIG. 4 illustrates a first portion of plurality of data storage devices located in a distributed hot zone relative to a second portion of the plurality of data storage devices located in a distributed cold zone, in accordance with various aspects of the present disclosure.
Figure 4:

FIG. 4 illustrates a first portion of plurality of data storage devices 110 located in a distributed hot zone relative to a second portion of the plurality of data storage 110 devices located in a distributed cold zone. FIG. 5 illustrates a heat map 300*b* associated with the distributed hot zone and distributed cold zone of FIG. 4. In the example illustrated in FIGS. 4 and 5, the electronic processor 106 logically shuffles the data storage devices included in drive locations #1-#8, which in the example of FIGS. 2 and 3 define the hot zone 304, such that data operations performed by those data storage devices are now performed by the data storage devices of drive locations #1, #8, #13, #19, #26, #32, #39, and #44, respectively. Similarly, the data operations previously performed by the data storage devices of drive locations #1, #8, #13, #19, #26, #32, #39, and #44 are performed, after the logical shuffling, by those of drive locations #1-#8, respectively. The electronic processor 106 may perform the logical shuffling such that data storage device locations defining a hot zone are shuffled to a maximum allowable distance from one another (e.g., such that they are evenly distributed throughout the chassis of the server 100).

Figure 6:
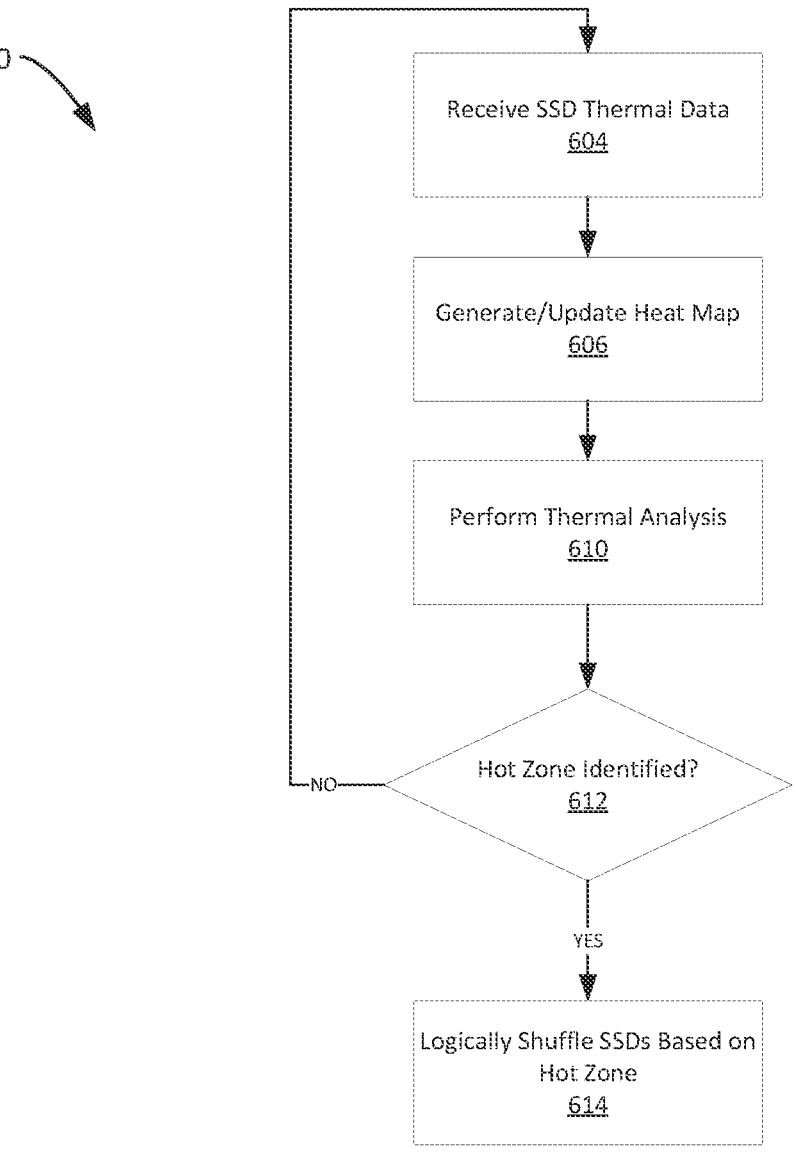
FIG. 6 illustrates a first example method for performing thermal management in a server, in accordance with various aspects of the present disclosure.

FIG. 6 illustrates a first example method 600 for performing thermal management in the server 100. The electronic processor 106 performs the method 600 in conjunction with other components of the server 100 (e.g., the thermal analysis module 118). While FIG. 6 illustrates a particular order of steps, in some embodiments, the method 600 may be performed in a different order. Additionally, in some embodiments, the method 600 includes additional steps or fewer steps.

The method 600 includes receiving, with the electronic processor 106, thermal data (e.g., thermal data 116) associated with each of the plurality of data storage devices 110 (at block 604). The method 600 includes generating and/or updating a heat map (e.g., heat maps 300*a* and 300*b*) based on the thermal data received from each of the plurality of data storage devices 110 (at block 608).

After updating the heat map, the electronic processor 106 performs thermal analysis of the heat map, for example, using a machine learning model included in the thermal analysis module 118 (at block 610). Based on the analysis of the heat map, the electronic processor 106 determines whether a hot zone exists in the plurality of data storage devices 110 (at decision block 612).

When the electronic processor 106 determines that a hot zone does exist in the plurality of data storage devices 110 ("YES" at decision block 612), the electronic processor 106 logically shuffles the plurality of data storage devices 110 to create a distributed hot zone (at block 614). In contrast, when the electronic processor 106 determines that a hot zone does not exist in the plurality of data storage devices ("NO" at decision block 612), the electronic processor 106 does not logically shuffle the plurality of data storage devices 110 and waits to receive and analyze new SSD thermal data (at block 604).

Figure 7:
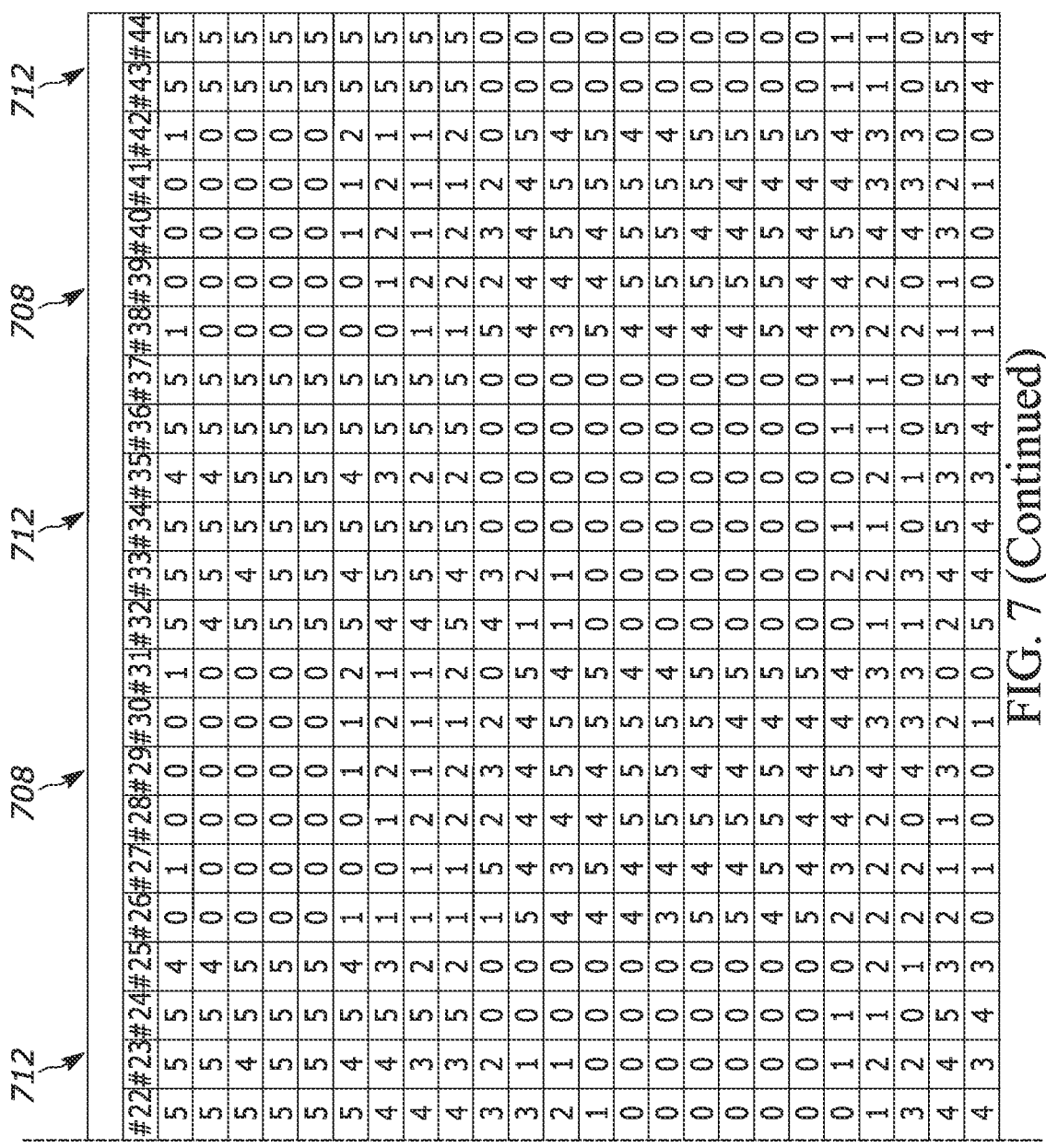
FIG. 7 illustrates a heat map associated with a plurality of data storage devices with hot zones and cold zones, in accordance with various aspects of the present disclosure.
Figure 8:
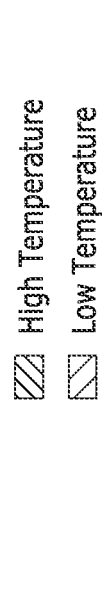
FIG. 8 illustrates a first portion of a plurality of data storage devices located in a hot zone relative to a second portion of the plurality of data storage devices located in a cold zone during a first time period, in accordance with various aspects of the present disclosure.
Figure 9:
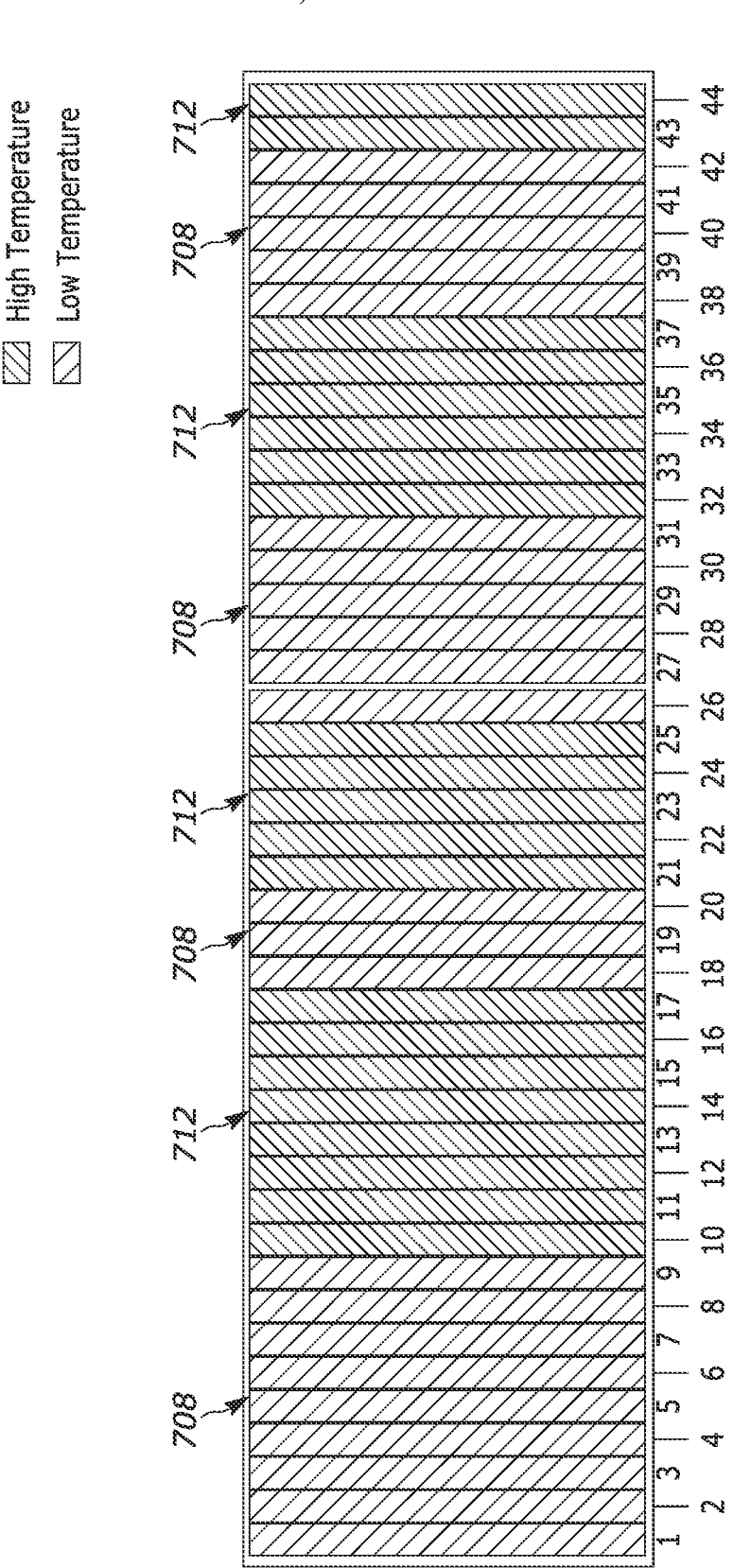
FIG. 9 illustrates a first portion of a plurality of data storage devices located in a hot zone relative to a second portion of the plurality of data storage devices located in a cold zone during a second time period that is different from the first time period, in accordance with various aspects of the present disclosure.

FIGS. 7-9 illustrate a second example use case of the plurality of data storage devices 110 before the electronic processor 106 performs a corrective action. For example, FIG. 7 illustrates a heat map 700*a* corresponding to the plurality of data storage devices 110. In the illustrated example, the electronic processor 106 may determine, based on the heap map 700*a*, that a first set of data storage devices 708 including data storage devices #1-#8, #18-#20, #26-#31, and #38-#42 are generally more active between the hours of 10:00 AM (UTC-5) to 9:00 PM (UTC-5) than the hours of 9:00 PM (UTC-5) to 10:00 AM (UTC-5). In contrast, the electronic processor 106 may determine that a second set of data storage devices 712 including data storage devices #10-#17, #21-#25, #32-#37, and #43-#44 are generally more active between the hours of 9:00 PM (UTC-5) to 10:00 AM (UTC-5) than the hours of 10:00 AM (UTC-5) to 9:00 PM (UTC-5). The electronic processor 106 may therefore determine that the first set of data storage devices 708 perform data operations during the working hours of end users located in a first time zone, and determine that the second set of data storage devices 712 perform data operations during the working hours of users located in a second time zone different from the first time zone.

Referring now to FIG. 8, the electronic processor 106 may determine that the first set of data storage devices 708 define hot zones during the hours of 10:00 AM (UTC-5) to 9:00 PM (UTC-5), and the second set of data storage devices 712 define cold zones during the hours of 10:00 AM (UTC-5) to 9:00 PM (UTC-5). In contrast, as illustrated in FIG. 9, the electronic processor 106 may determine that the first set of data storage devices 708 define cold zones during the hours of 9:00 PM (UTC-5) to 10:00 AM (UTC-5), and that the second set of data storage devices 712 define hot zones during the hours of 9:00 PM (UTC-5) to 10:00 AM (UTC-5).

Figure 10:
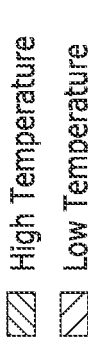
FIG. 10 illustrates a plurality of data storage devices with distributed hot zones and distributed cold zones during the first time period, in accordance with various aspects of the present disclosure.
Figure 10:
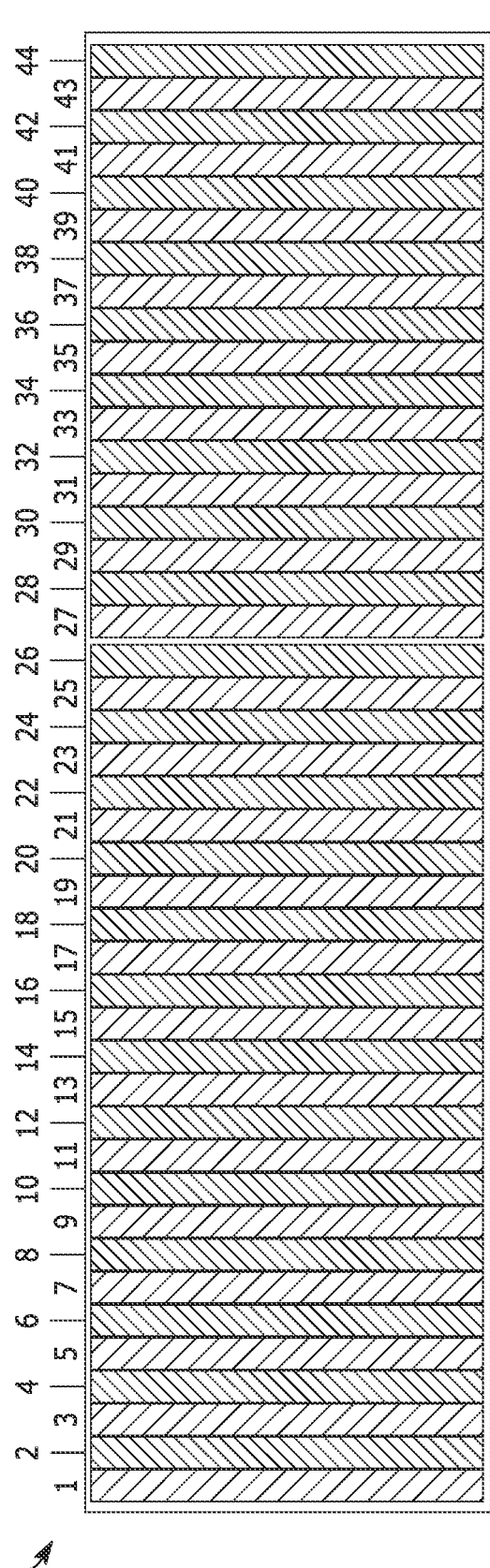
Figure 11:
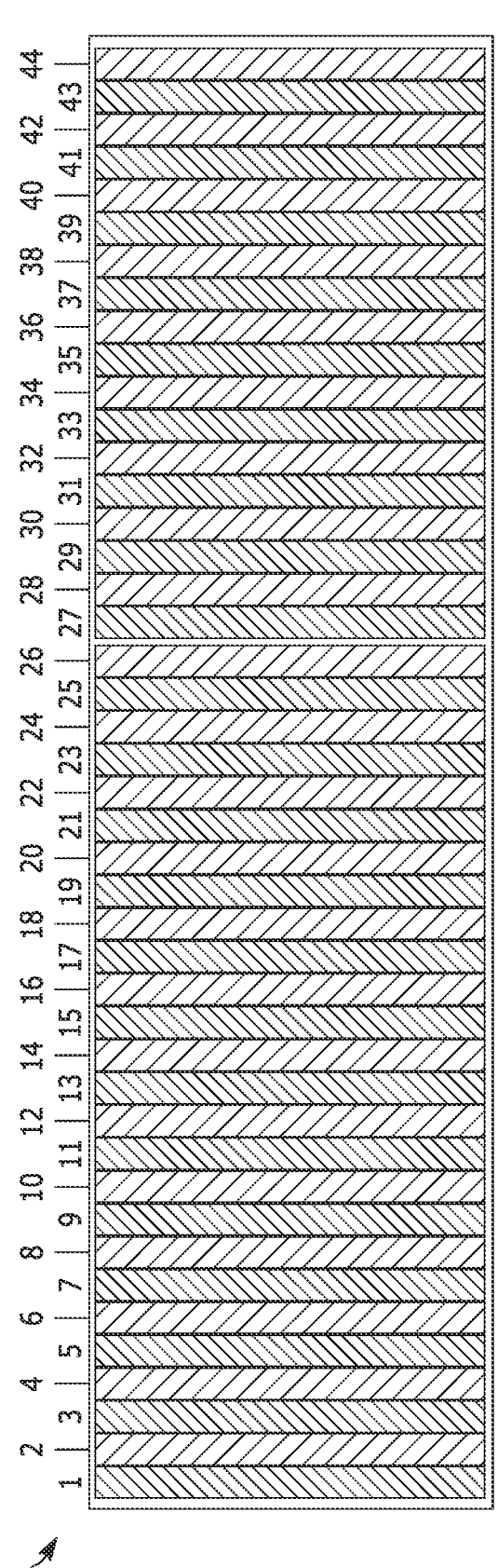
FIG. 11 illustrates the plurality of data storage devices with distributed hot zones and distributed cold zones during the second time period that is different from the first time period, in accordance with various aspects of the present disclosure.

The electronic processor 106 may logically shuffle the plurality of data storage devices 110 according to a determined pattern. For example, FIGS. 10-12 illustrate the second example use case of the plurality of data storage devices 110 after the electronic processor 106 performs the corrective action. As illustrated in FIGS. 10-11 and reflected in the updated heat map 700*b* of FIG. 12, the electronic processor 106 logically shuffles the plurality of data storage devices 110 such that none of the data storage devices which define a hot zone during a predetermined period of time (e.g., the hours of 10:00 AM (UTC-5) to 9:00 PM (UTC-5)) are immediately adjacent to one another.

Figure 13:
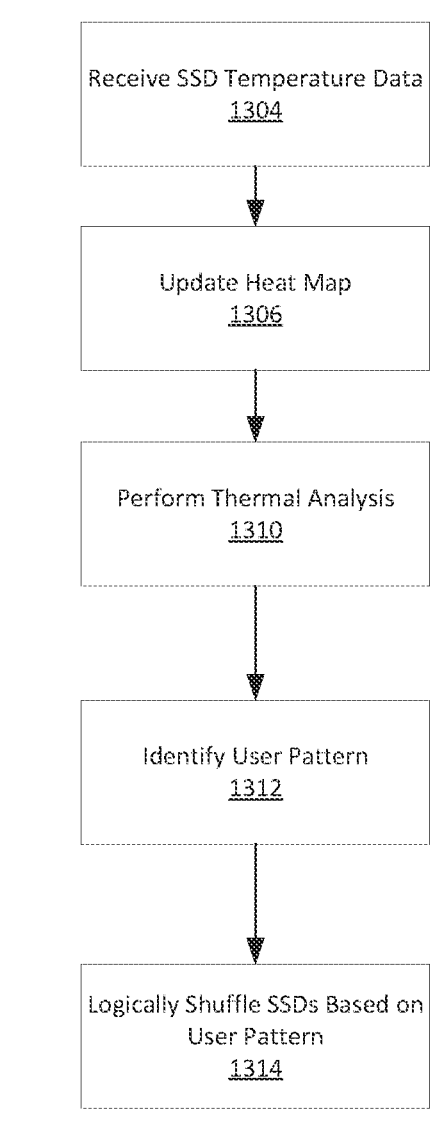
FIG. 13 illustrates a second example method for performing thermal management in a server, in accordance with various aspects of the present disclosure.

FIG. 13 illustrates a second example method 1300 for logically shuffling the plurality of data storage devices 110. The electronic processor 106 performs the method 1300 in conjunction with other components of the server 100 (e.g., the thermal analysis module 118). While FIG. 13 illustrates a particular order of steps, in some embodiments, the method 1300 may be performed in a different order. Additionally, in some embodiments, the method 1300 includes additional steps or fewer steps.

The method 1300 includes receiving, with the electronic processor 106, thermal data (e.g., thermal data 116) associated with each of the plurality of data storage devices 110 (at block 1304). The method 1300 includes generating and/or updating a heat map (e.g., heat maps 700*a* and 700*b*) based on the thermal data received from each of the plurality of data storage devices 110 (at block 1306).

After updating the heat map, the electronic processor 106 performs thermal analysis of the heat map, for example, using a machine learning model included in the thermal analysis module 118 (at block 1310). The method 1300 includes identifying, based on the thermal data 116 associated with the plurality of data storage devices 110, a pattern associated with the usage of the plurality of data storage devices 110 (block 1312). The pattern may include an identification of data storage devices which are used more frequently than others during certain time periods, an identification of data storage devices that are used more frequently during certain days of the week (e.g., weekends and/or weekdays), and/or an identification of data storage devices which are used more frequently than others during all time periods. The electronic processor 106 may identify multiple patterns, and logically shuffle the plurality of data storage devices 110 multiple times throughout a day, a week, a month, a year, or other period of time.

After the electronic processor 106 identifies a user pattern, the electronic processor 106 logically shuffles the plurality of data storage devices 110 according to the user pattern (at block 1314). The electronic processor 106 logically shuffles the plurality of data storage devices 110 such that a set of data storage devices associated with a particular user pattern such that logical operations performed by the set of data storage devices are not performed by data storage devices immediately adjacent one another.

Figure 14:
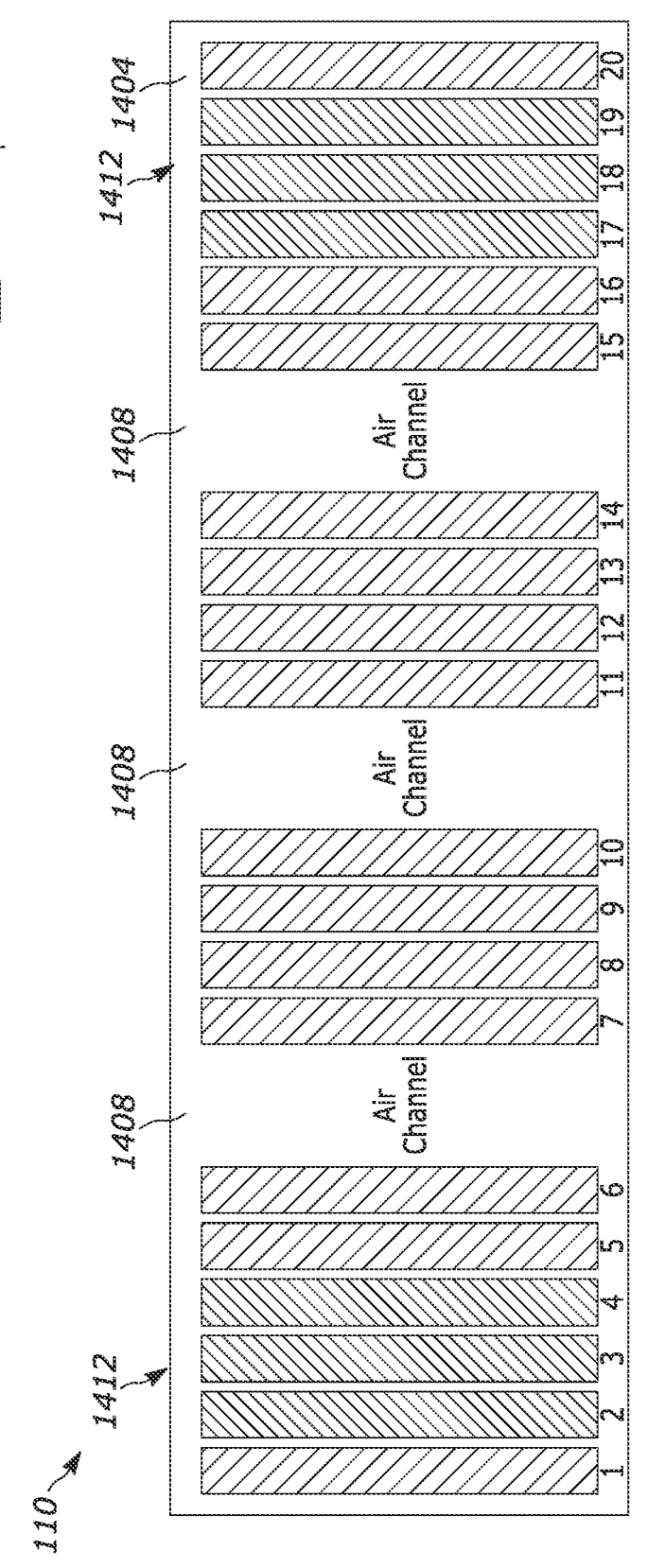
FIG. 14 illustrates a first portion of a plurality of data storage devices located in a hot zone relative to a second portion of the plurality of data storage devices located in a cold zone, in accordance with various aspects of the present disclosure.
Figure 15:
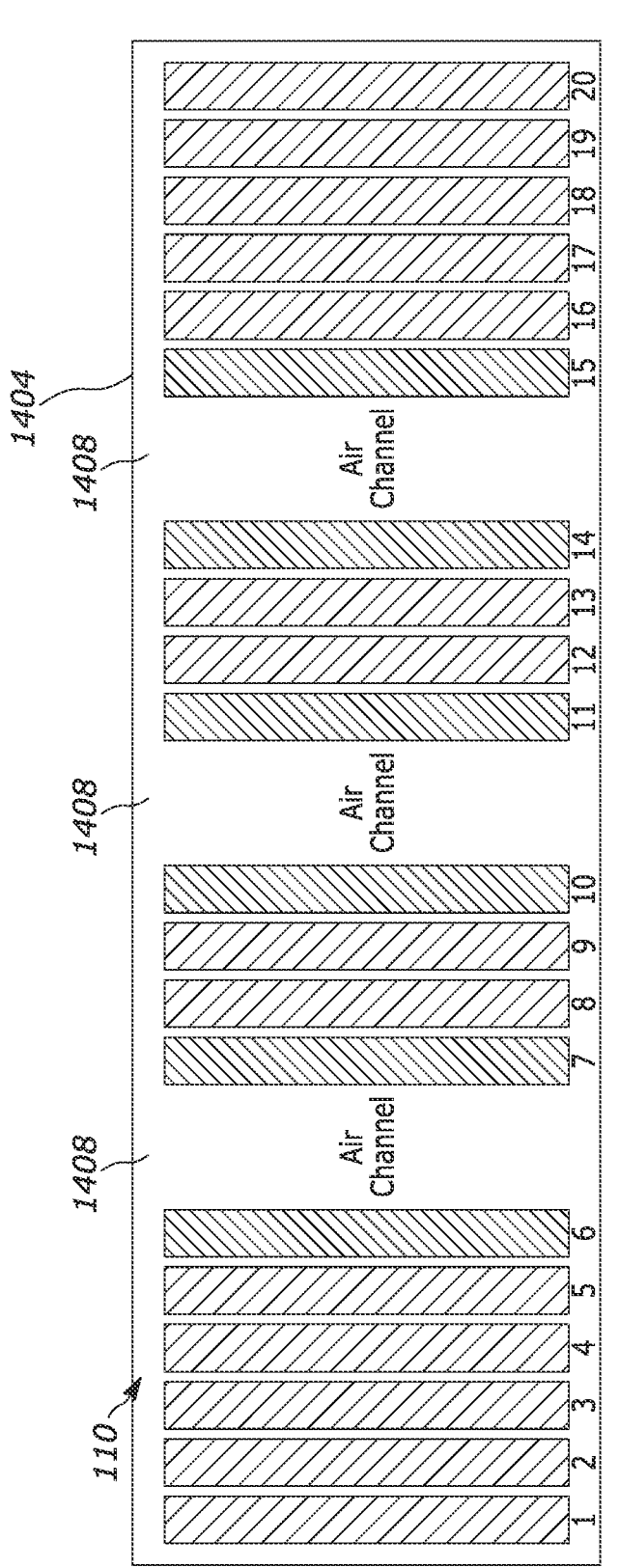
FIG. 15 illustrates a plurality of data storage devices with distributed hot zones adjacent to air channels, in accordance with various aspects of the present disclosure.

Referring now to FIGS. 14 and 15, in some instances, the plurality of data storage devices 110 are disposed in a chassis 1404 of the server 100 including one or more air channels 1408. The air channels 1408 may be operable to improve heat dissipation for the plurality of data storage devices 110, and, in particular, the data storage devices disposed adjacent the air channels 1408. As illustrated in FIG. 14, the electronic processor 106 may identify hot zones 1412 including data storage devices #2-#4 and #17-#19. The electronic processor 106 may determine (e.g., based on stored information associated with a physical configuration of the server 100) that air channels 1408 are disposed between data storage devices #6 and #7, #10 and #11, and #14 and #15. Accordingly, the electronic processor 106 may logically shuffle the plurality of data storage devices 110 such that logical operations performed by data storage devices defining hot zones 1412 are instead performed by data storage devices adjacent to the air channels 1408.

For example, FIG. 15 illustrates the plurality of data storage devices 110 with distributed hot zones directly adjacent to the air channels 1408. As illustrated in FIG. 15, the electronic processor 106 logically shuffles the data storage devices included of drive locations #2-#4 and #17-#19, which define the hot zones 1412 in FIG. 14, such that data operations performed by those data storage devices are instead performed by the data storage devices of drive locations #6 and #7, #10 and #11, and #14 and #15, respectively. Similarly, the data operations previously performed by the data storage devices #6 and #7, #10 and #11, and #14 and #15 are performed, after the logical shuffling, by those of drive locations #2-#4 and #17-#19, respectively.

Figure 16:
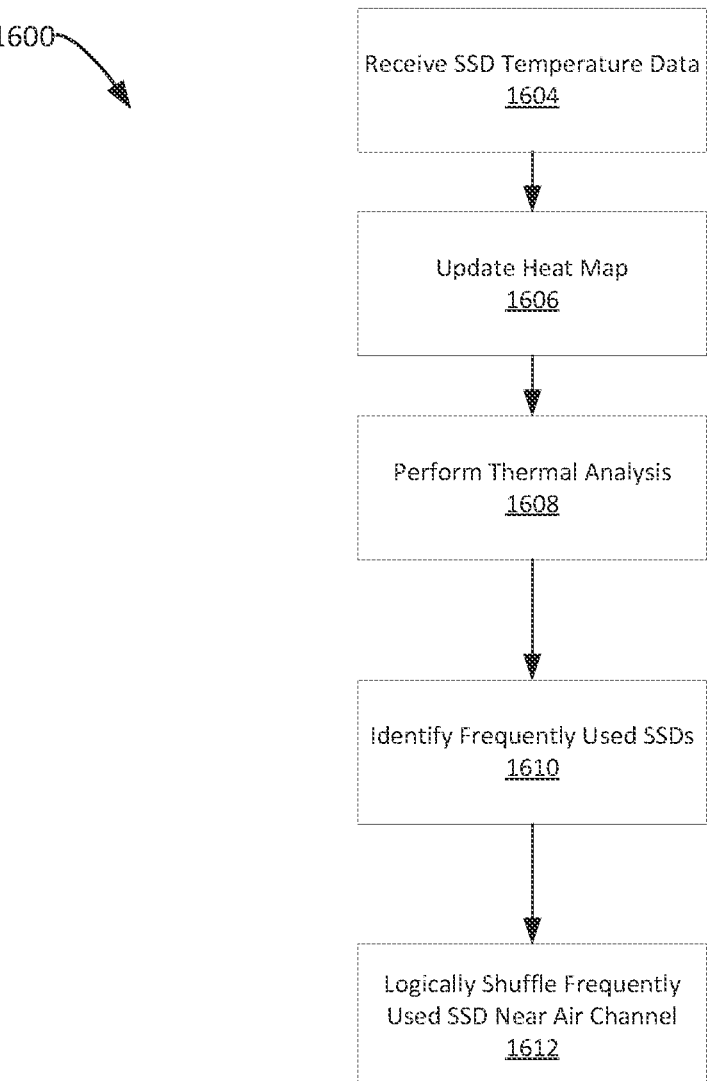
FIG. 16 illustrates a third example method for performing thermal management in a server, in accordance with various aspects of the present disclosure.

FIG. 16 illustrates a third example method 1600 for logically shuffling the plurality of data storage devices 110. The electronic processor 106 performs the method 1600 in conjunction with other components of the server 100 (e.g., the thermal analysis module 118). While FIG. 16 illustrates a particular order of steps, in some embodiments, the method 1600 may be performed in a different order. Additionally, in some embodiments, the method 1600 includes additional steps or fewer steps.

The method 1600 includes receiving, with the electronic processor 106, thermal data (e.g., thermal data 116) associated with each of the plurality of data storage devices 110 (at block 1604). The method 1600 includes generating and/or updating a heat map based on the thermal data received from each of the plurality of data storage devices 110 (at block 1606).

After updating the heat map, the electronic processor 106 performs thermal analysis of the heat map, for example, using a machine learning model included in the thermal analysis module 118 (at block 1608). Based on the analysis of the heat map, the electronic processor 106 identifies one or more data storage devices that are used more frequently than others of the plurality of data storage devices 110 and therefore define a hot zone (at block 1610).

After the electronic processor 106 identifies a hot zone, the electronic processor 106 logically shuffles the plurality of data storage devices 110 such that the data operations performed by the data storage devices included in the hot zone are performed by data storage devices disposed directly adjacent to the air channels (e.g., the air channels 1408) (at block 1612).

Figure 17:
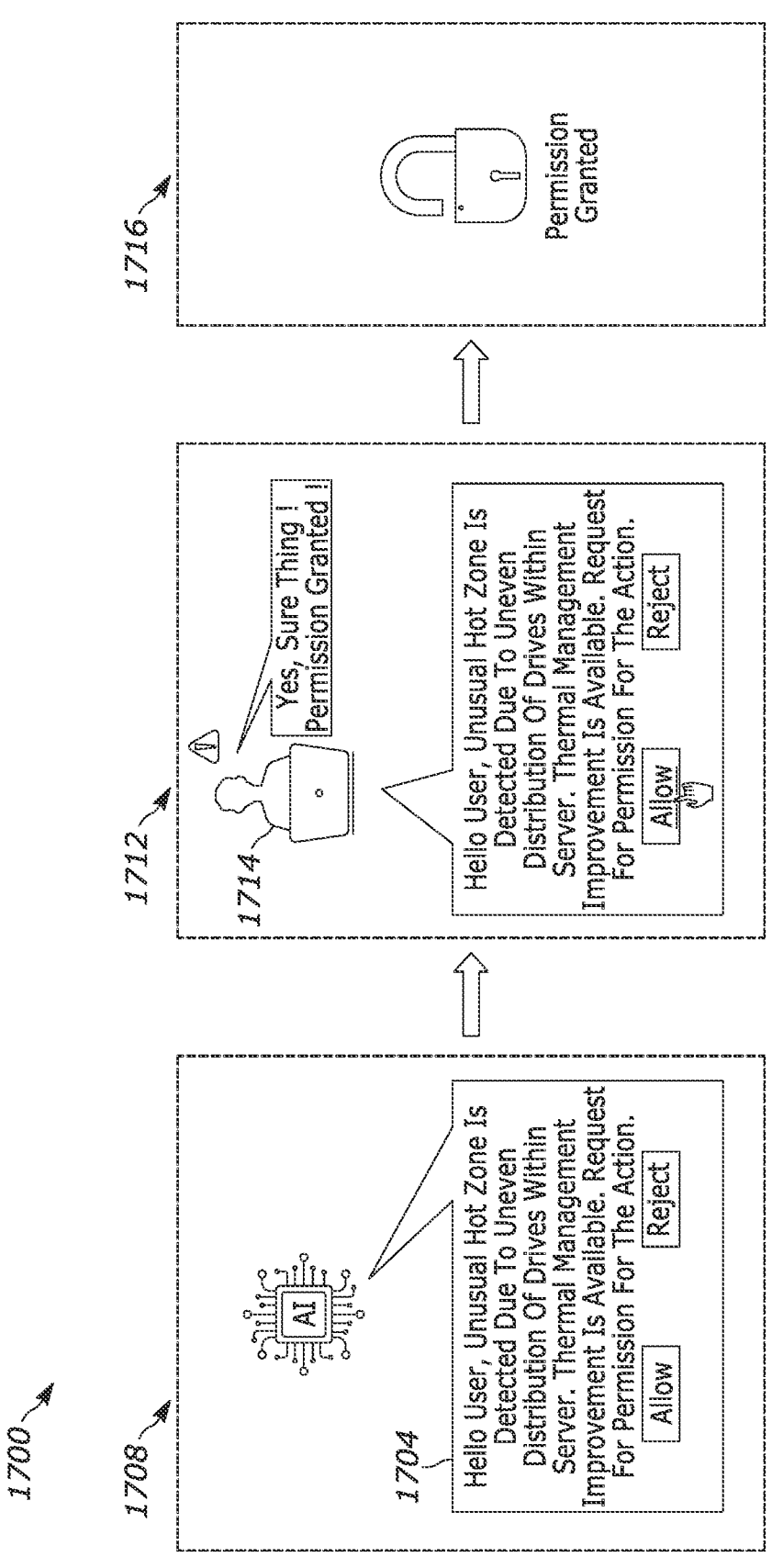
FIG. 17 illustrates a thermal management permission process, in accordance with various aspects of the present disclosure.

FIG. 17 illustrates an example thermal management permission process 1700 performed in the server 100. In some instances, the electronic processor 106 is configured to provide a notification (e.g., notification 1704) to the user interface 108 of the server 100 in response to identifying a hot zone in the plurality of data storage devices 110 (at block 1708).

The notification 1704 may include a request, generated by the electronic processor 106, for permission by an operator of the server 100 (e.g., operator 1714) to perform a corrective action for thermal management of the server 100. In some instances, the electronic processor 106 provides the notification 1704 to the user interface 108 each time a logical shuffling of the plurality of data storage devices 110 is requested. In some instances, the electronic processor 106 provides the notification 1704 to the user interface 108 only once before an initial logical shuffling of the plurality of data storage devices 110. In some instances, the notification 1704 includes information related to the corrective action, such as for example, a proposed arrangement of drive locations. In response to receiving, with the user interface 108, permission from the operator 1714 (at block 1712), the electronic processor 106 performs the logical shuffling of the plurality of data storage devices 1716.

It is to be understood that the above description is intended to be illustrative and not restrictive. Many embodiments and applications other than the examples provide would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A server comprising:
   a memory configured to store a machine learning model;
   a plurality of data storage devices disposed in a chassis; and
   a controller coupled to the memory and configured to:
     receive thermal data associated with the plurality of data storage devices;
     apply a machine learning model to identify, based on the thermal data, a first portion of the plurality of data storage devices located in a hot zone relative to a second portion of the plurality of data storage devices located outside of the hot zone; and
     based on an identification of the first portion of the plurality of data storage devices located in the hot zone, perform thermal management of the plurality of data storage devices, wherein, to perform the thermal management, the controller is further configured to logically shuffle the plurality of data storage devices to create a distributed hot zone.

2. The server of claim 1, wherein to identify the first portion of the plurality of data storage devices located in the hot zone, the controller is further configured to:
   determine a pattern associated with a usage of each of the plurality of data storage devices, and logically shuffle the plurality of data storage devices based on the pattern.

3. The server of claim 2, wherein the pattern includes a determination that the first portion of the plurality of data storage devices are used more frequently than the second portion of the plurality of data storage devices during a first time period.

4. The server of claim 3, wherein the pattern includes a determination that the second portion of the plurality of data storage devices are used more frequently than the first portion of the plurality of data storage devices during a second time period different than the first time period.

5. The server of claim 1, wherein
   the chassis includes at least one air channel,
   the second portion of the plurality of data storage devices includes at least one data storage device disposed directly adjacent to the at least one air channel, and
   to logically shuffle the plurality of data storage devices, the controller is further configured to exchange memory locations of at least one data storage device included in the first portion of the plurality of data storage devices located in the hot zone with memory locations of the at least one data storage device disposed directly adjacent to the at least one air channel.

6. The server of claim 1, wherein the controller is further configured to:
   generate a heat map of the plurality of data storage devices, the heat map including thermal data associated with the plurality of data storage devices over a period of time.

7. The server of claim 1, further comprising a user interface, wherein the controller is further configured to:
   in response to identifying the first portion of the plurality of data storage devices located in the hot zone, provide a notification to the user interface, the notification including a request for permission to perform the thermal management, and
   perform the thermal management in response to receiving permission from an operator of the server through the user interface.

8. The server of claim 1, wherein the thermal data includes an amount of data operations performed by each of the plurality of data storage devices, and
   an amount of data operations performed by the first portion of the plurality of data storage devices located in the hot zone is greater than an amount of data operations performed by the second portion of the plurality of data storage devices located outside of the hot zone.

9. The server of claim 1, wherein the thermal data includes a temperature measurement associated with each of the plurality of data storage devices, and
   a temperature associated with the first portion of the plurality of data storage devices located in the hot zone is greater than a temperature associated with the second portion of the plurality of data storage devices.

10. A method for performing thermal management in a server, the method comprising:
    receiving thermal data associated with a plurality of data storage devices;
    identifying, based on thermal data, a first portion of the plurality of data storage devices located in a hot zone relative to a second portion of the plurality of data storage devices located outside of the hot zone; and
    based on an identification of the first portion of the plurality of data storage devices located in the hot zone, performing thermal management of the plurality of data storage devices, wherein, performing thermal management includes logically shuffling the plurality of data storage devices to create a distributed hot zone.

11. The method of claim 10, wherein identifying the first portion of the plurality of data storage devices includes determining a pattern associated with a usage of each of the plurality of data storage devices, and the method includes logically shuffling the plurality of data storage devices based on the pattern.

12. The method of claim 11, wherein the pattern includes a determination that the first portion of the plurality of data storage devices are used more frequently than the second portion of the plurality of data storage devices during a first time period.

13. The method of claim 12, the pattern includes a determination that the second portion of the plurality of data storage devices are used more frequently than the first portion of the plurality of data storage devices during a second time period different than the first time period.

14. The method of claim 10, wherein the plurality of data storage devices is disposed in a chassis having at least one air channel, the second portion of the plurality of data storage devices includes at least one data storage device disposed directly adjacent to the at least one air channel, and logically shuffling the plurality of data storage devices includes exchanging memory locations of at least one data storage device included in the first portion of the plurality of data storage devices located in the hot zone with memory locations of the at least one data storage device disposed directly adjacent to the at least one air channel.

15. The method of claim 10, further comprising:

generating a heat map of the plurality of data storage devices, the heat map including thermal data associated with the plurality of data storage devices over a period of time.

16. The method of claim 10, further comprising:

in response to identifying the first portion of the plurality of data storage devices located in the hot zone relative, providing a notification to a user interface of the server, the notification including a request for permission to perform the thermal management, and performing the thermal management in response to receiving permission from an operator of the server through the user interface.

17. The method of claim 10, wherein the thermal data includes an amount of data operations performed by each of the plurality of data storage devices, and an amount of data operations performed by the first portion of the plurality of data storage devices is greater than an amount of data operations performed by the second portion of the plurality of data storage devices.

18. The method of claim 10, wherein the thermal data includes a temperature measurement associated with each of the plurality of data storage devices, and a temperature associated with the first portion of the plurality of data storage devices is greater than a temperature associated with the second portion of the plurality of data storage devices.

19. A non-transitory computer readable medium storing instructions that, when executed by a controller, causes the controller to perform a set of operations comprising:

identifying, based on thermal data, a first portion of a plurality of data storage devices located in a hot zone relative to a second portion of the plurality of data storage devices located outside of the hot zone; and based on an identification of the first portion of the plurality of data storage devices located in the hot zone, performing thermal management of the plurality of data storage devices, wherein, the thermal management includes logically shuffling the plurality of data storage devices to create a distributed hot zone.

20. The non-transitory computer readable medium of claim 19, wherein identifying the first portion of the plurality of data storage devices located in the hot zone relative to the second portion of the plurality of data storage devices further includes determining a pattern associated with a usage of each of the plurality of data storage devices, and logically shuffling the plurality of data storage devices based on the pattern.

* * * * *